(12) United States Patent
Weber et al.

(10) Patent No.: US 8,382,963 B2
(45) Date of Patent: Feb. 26, 2013

(54) DROPLET-FREE COATING SYSTEMS MANUFACTURED BY ARC-EVAPORATION METHOD

(75) Inventors: Frank Weber, Eichstaedt (DE); Samuel Harris, Albstadt (DE)

(73) Assignee: Guehring OHG, Albstadt (DE)

( * ) Notice: Subject to any disclaimer, the term of this patent is extended or adjusted under 35 U.S.C. 154(b) by 1164 days.

(21) Appl. No.: 12/059,116

(22) Filed: Mar. 31, 2008

(65) Prior Publication Data

US 2008/0298910 A1 Dec. 4, 2008

(30) Foreign Application Priority Data

Mar. 29, 2007 (DE) .......................... 10 2007 015 587

(51) Int. Cl.
*C23C 30/00* (2006.01)
(52) U.S. Cl. .......... 204/192.12; 204/192.15; 204/192.16
(58) Field of Classification Search ............. 204/192.12, 204/192.15, 192.16
See application file for complete search history.

(56) References Cited

U.S. PATENT DOCUMENTS

| | | | | |
|---|---|---|---|---|
| 5,279,723 A | * | 1/1994 | Falabella et al. | ......... 204/192.38 |
| 5,317,235 A | | 5/1994 | Treglio | |
| 6,103,074 A | * | 8/2000 | Khominich | ............. 204/192.38 |
| 6,495,002 B1 | * | 12/2002 | Klepper et al. | .......... 204/192.38 |
| 6,663,755 B2 | * | 12/2003 | Gorokhovsky | .......... 204/192.38 |
| 7,247,221 B2 | * | 7/2007 | Stowell, Jr. | .............. 204/192.12 |
| 2003/0148145 A1 | | 8/2003 | Yamamoto et al. | |

FOREIGN PATENT DOCUMENTS

DE 102 33 222 A1 2/2003

OTHER PUBLICATIONS

Takikawa "Review of Cathodic Arc Deposition for Preparing Droplet-Free Thin Films" International Symposium on Discharges & Electrical Insulation in Vacuum, 2006 p. 525-530.*
Zimmer "Vacuum arc depostion by using a Venetian blind particle filter" Surface & Coatings Techn 2000 (2005) p. 440-443.*
Bilek et al "Characterization of a Linear Venetian-Blind Macroparticle Filter for Cathodic Vacuum Arcs" IEEE Transactions on Plasma Science, vol. 27, No. 4 Aug. 1999.*
Schirmer et al "Efficiency of a Venetian blind filter" phy.stat.sol© 5, No. 4, (2008) p. 927-931.*
P. J. Martin, et al., "Review of the filtered vacuum arc process and materials deposition", Thin Solid Films 394 (2001) pp. 1-15.
S. J. Dixit, et al., "Characterization of aluminum nitride thin films deposited by filtered cathodic arc process", Thin Solid Films 398-399 (2001) pp. 17-23.
H. Randhawa, et al., "Technical Note: A Review of Cathodic Arc Plasma Deposition Processes and Their Applications", Surface and Coatings Technology, 31 (1987) pp. 303-318.

* cited by examiner

*Primary Examiner* — Archene Turner
(74) *Attorney, Agent, or Firm* — Oblon, Spivak, McClelland, Maier & Neustadt, L.L.P.

(57) ABSTRACT

A droplet-free wear-resistant coating is manufactured by depositing a wear resistant nitride coating containing a nitride layer which contains at least one metal or metal compound of a metal selected from the group consisting of Ti, Cr, Al, Si and combinations thereof, on a surface of a substrate by cathodic-arc evaporation using a Venetian blind filter system in front of an arc cathode; to reduce metal microdroplets and/or metal microparticles in the wear resistant coating compared to an wear resistant coating obtained without a Venetian blind filter system.

9 Claims, 11 Drawing Sheets

Summary of Filter development

Filter I
- Low deposition rate
- Good droplet filtering

Filter II
- Improved deposition rate
- Good droplet filtering $\Rightarrow$ Pressure v Deposition Rate v Droplets

Filter III

- Optimisation of S, D, $\theta_{crit.}$ for further improvement of the depostion parameters

DROPLET-FREE COATING SYSTEMS MANUFACTURED BY ARC-EVAPORATION METHOD

BACKGROUND OF THE INVENTION

1. Field of the Invention

The present invention relates to the deposition of a droplet-free nitride wear-resistant coating containing metal components such as Ti, Cr, Al, Si which can be applied, for example, to cutting tools and wear parts.

2. Discussion of the Background

Wear resistant coatings are layers of hard material with thicknesses of approximately 1 to 10 μm, deposited on the tool surface by cathodic arc-evaporation, which is a PVD method (physical vapor deposition).

Cathodic arc-coating methods have already been used for many years for the deposition of wear resistant layers on chip-removing tools. At the Gühring group (G-ELIT Co. Berlin), such a method was developed in recent years by the Coating R&D Department and then used successfully in production and coating service, and was protected under EP 0885981A2. This method is used at Gühring to manufacture TiN and TiAlN coatings, TiAlN/TiN multi-layer coatings and TiAlCrN coatings.

The advantages of the arc-coating technique lie in a very high deposition rate and very dense coating structure, which are achieved by the high energy or momentum input by the metal ions ($Ti^+$, $Ti^{++}$, $Al^+$, $Al^{++}$). Approximately 80% of the metal particles vaporized by the cathodic arc are subsequently ionized in the plasma and accelerated as positively charged particles to the tools. Together with the nitrogen atoms from the plasma, this results in growth of a metal nitride coating.

During the coating process, metal microparticles (0.5 to 5 μm) are also incorporated into the coatings. These originate from vaporized material (titanium or titanium/aluminum) of the arc cathode. During the vaporization process, small zones of μm size are locally melted by the cathodic arc as it wanders over the cathode. As a result, the metal droplets are spattered toward the tools to be coated. These "droplets" increase the roughness of the tool and thus hinder chip flow during drilling. For deep hole drilling larger than 3 times the drill diameter, the danger of tool breakage during the first holes is very great. In addition, clogging of the chips in the slot can occur.

Cathodic arc evaporation is a widely employed technique for using dense and highly ionized gas discharges for deposition of hard, wear-resistant PVD coatings. As a result of the high degree of ionization, the high deposition rate and relatively low costs of the electrical power supply units, the cathodic arc-coating method has been used successfully by the manufacturers of PVD coatings, especially in the area of wear resistant coatings for HSS (High Speed Steel) and hard-metal cutting tools. A major disadvantage of the method is the emission of metal microparticles, known as droplets, which during the coating process are transferred from the cathode material into the growing coatings, where they form defects.

While the presence of the droplets prevents application of the arc-vaporization process in the fields of optics, electronics and corrosion protection, the effect of the droplets in PVD coatings for cutting tools has heretofore been tolerated as less critical. In the future, however, smooth surfaces of coated hard-metal tools will become increasingly important in meeting the stringent requirements of tool applications in aerospace, in the automobile industry and in mechanical engineering and in preventing disastrous failure of precision tools during service.

SUMMARY OF THE INVENTION

It is therefore an object of the present invention to provide a method for producing droplet-free wear resistant coatings for cutting tools so as to satisfy the increased surface quality requirements for high-tech applications, such as chip-removing machining of superalloys, carbon steels, Al—Si alloys and applications with high-level cutting parameters (high-speed cutting (HSC) and high-performance cutting (HPC)).

This and other objects have been achieved by the present invention the first embodiment of which includes a method for manufacturing a droplet-free wear-resistant coating, comprising:
  depositing a wear resistant nitride coating comprising
    a nitride layer comprising at least one metal or metal compound of a metal selected from the group consisting of Ti, Cr, Al, Si and combinations thereof,
on a surface of a substrate by cathodic-arc evaporation using a Venetian blind filter system in front of an arc cathode; to reduce metal microdroplets and/or metal microparticles in said wear resistant coating compared to a wear resistant coating obtained without a Venetian blind filter system.

In another embodiment, the present invention provides a wear resistant coating, obtained by the above method and comprising:
  a nitride coating comprising
    at least one metal or metal compound of a metal selected from the group consisting of Ti, Cr, Al, Si and combinations thereof;
  wherein a surface of said wear resistant coating is smoother compared to a wear resistant coating obtained without a Venetian blind filter system because of a reduction of metal micro droplets and/or metal microparticles in the coating.

In yet another embodiment, the present invention provides that the above wear resistant coating is suitable for cutting tools and wear parts.

BRIEF DESCRIPTION OF DRAWINGS

FIG. 5 shows the reduction of droplets by droplet diameter.

FIG. 10 shows a summary of the properties of preferred filters I, II and III.

DETAILED DESCRIPTION OF THE INVENTION

Figure 1:
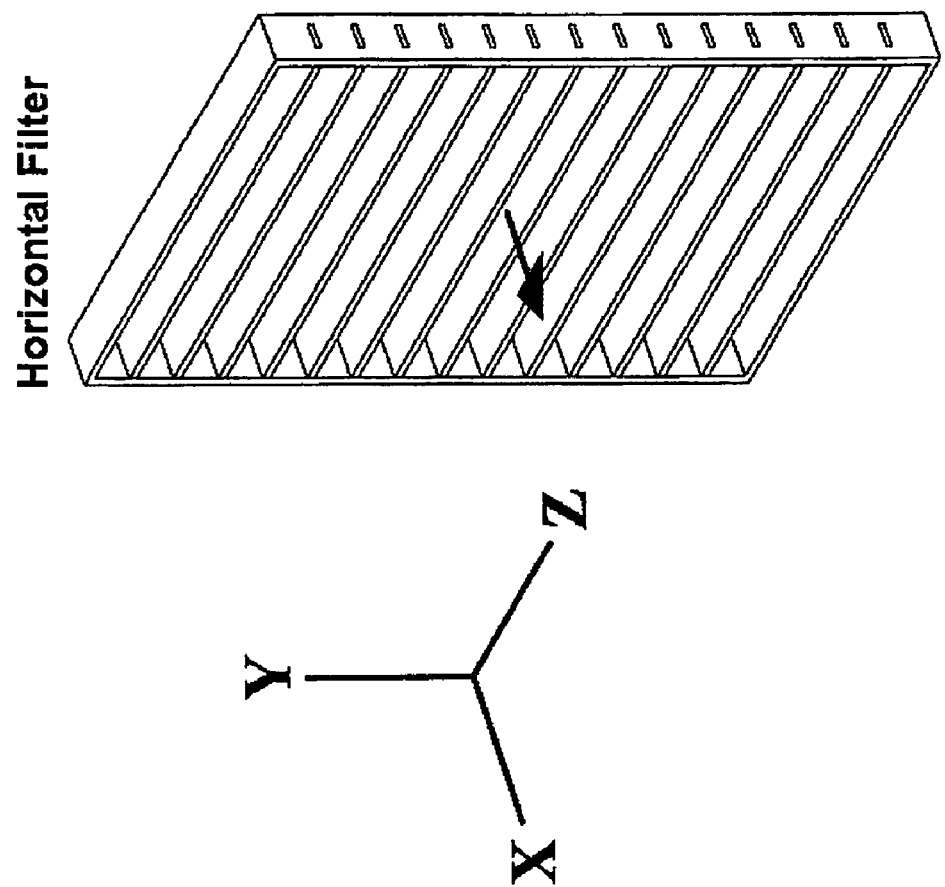
FIG. 1 shows a filter structure according to an embodiment of the present invention.

The present invention relates to the deposition of a droplet-free nitride wear-resistant coating containing metal components such as Ti, Cr, Al, Si which can be applied, for example, to cutting tools and wear parts. Cutting tools include, for example, rotating shanked cutting tools such as drills, endmills, screw taps, reamers, etc. for chip-removing machining of metals. Wear parts include, for example, moulding parts or moving elements, punching and forming tools, medical tools, Ti components in the motor sport and aviation industry, and combustion engine components.

In one embodiment, the present invention relates to the deposition of a substantially droplet-free (substantially free of metal microparticles or metal micro droplets) nitride wear resistant coating based on Ti, TiAl and Cr.

Surprisingly, for the first time, the inventors of the of the present invention were able to reduce the particles having a particle size of >1.51 μm, and preferably >0.8 μm by at least 75% using the Venetian blind filter system. In addition, surprisingly, a high deposition rate of 1.5 to 3.0 μm per hour using TiN was achieved which is close to the deposition rate of TiN without using a filter.

Extensive investigations of droplet emission and the associated phenomena have been conducted in the past. The emission of metal microparticles in the cathodic arc method has been described by various authors (Mattox HBook22#/McLure JAP 1974/Jüttner Plasmaphys. 1979) as the emission of molten or solid particles of the arcing point due to thermal and hydrodynamic effects. In his model of a cathodic arcing point, Jüttner (reference: same as above) explains that droplets are emitted from an arcing point melted on the arc cathode by a gas discharge.

One possibility for minimizing the number of droplets in wear resistant coatings deposited by means of cathodic arc evaporation is to mount a suitable filter system between the arc cathode and the substrates to be coated. Heretofore the research activities have been oriented toward magnetic filter systems, which are based on special solenoid geometries. Such designs usually comprise a nonlinear plasma conduit, around which a solenoid is wound in order to guide the plasma with an axial magnetic field and to collect the droplets in a well-defined zone of the filter. In this way the droplets are separated from the plasma flow, allowing a droplet-free and smooth wear-resistant coating to be deposited on a substrate.

While the nonlinear droplet filters achieve effective reduction of the droplets, the rate of deposition of the coating becomes unacceptable and therefore uneconomic because of the inefficient plasma transfer through the filter conduit. The deposition rate is reduced by >75% for toroidal filters and >90% for sigmoidal filter systems. The main disadvantages of the wound and linear conduit filter systems are therefore the extremely low deposition rate, a design that is technologically too complex, excessive space requirement in the coating machine and very high costs.

An alternative to the magnetic conduit filter is what is known as the Venetian blind filter. In such systems, the filter-plate elements are arranged in a linear Venetian blind structure (such as a louvered structure), in which they are oriented parallel to one another in the direction of the plasma flow in "open" configuration. "Open" configuration means that there is a line-of-sight relationship between the arc cathode and the substrate. The possibility also exists of using a "closed" configuration, in which there is no line-of-sight relationship between the cathode and the substrate.

In addition, a magnetic field can be generated in both Venetian blind filter systems (open or closed configuration), by passing an electric current through the filter plates. When the current is passed in opposite direction through adjacent plates, the magnetic lines of force are aligned and pass through the spaces between the filter plates in substrate direction. This is a physical effect due to magnetical properties.

The main advantages of the Venetian blind filter of the present invention are compact and flexible design, technologically simple construction and the fact that power supply units already available in plant technology for the arc voltage can also be utilized for generating the current for the magnetic field passing through the Venetian blind filter.

The present invention provides a method that screens out the metal microparticles (or metal microdroplets) from the plasma generated by the arc, thus allowing the ionized and neutral metal and nitrogen ions or atoms to reach the tool surface. With this method, near droplet-free wear resistant coatings are deposited on hard-metal cutting tools and components for preventing wear.

Within the context of the present invention, "droplet-free" means free or substantially free of metal microparticles or metal micro-droplets, in particular free or substantially free of metal microparticles or metal micro droplets having a diameter of from 0.1 to 5 μm.

In one embodiment, "droplet-free" includes that a density of the droplets with a diameter (or cross section) of >1.5 μm is reduced by at least 75% in said coating, preferably at least 80%, preferably at least 90%, more preferably at least 95%, even more preferably at least 99% and most preferably at least 99.5% compared to a coating which is produced without using a filter system according to the present invention. The density of the droplets with a diameter of >1.5 μm is reduced to reduce the roughness of the coating significantly.

In a preferred embodiment, "droplet-free" includes that a density of the droplets with a diameter (or cross-section) of >0.8 μm is reduced by at least 75% in said coating, preferably at least 80%, preferably at least 90%, more preferably at least 95%, even more preferably at least 99% and most preferably at least 99.5% compared to a coating which is produced without using a filter system according to the present invention. The density of the droplets with a diameter of >0.8 μm is reduced to reduce the roughness of the coating significantly. See for example FIG. 5.

The size of the metal microdroplets or metal microparticles to be reduced may be in the order of 0.1 to 5 μm, preferably 0.2 to 5 μm, more preferably 0.5 to 5 μm, even more preferably 0.5 to 2.5 μm. The size of the micro-droplets to be reduced includes all values and subvalues therebetween, especially including 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 3, 3.5, 4 and 4.5 μm. However, in most cases droplets with sizes bigger than 2.2 μm are very rare and can be filtered easily by the Venetian blind filter. Droplets below 2.2 μm diameter are important to be filtered in one embodiment of the present invention.

First Embodiment

A first filter structure was held in simple and flexible manner (FIG. 1). In particular, the influence of the geometric variables, such as filter-element spacing and distance to the cathode surface, were investigated. The filter plate spacing (spacing of the Venetian blinds) is preferably 5 to 40 mm, more preferably 10 to 30 mm. The filter plate spacing includes all values and subvalues therebetween, especially including 6, 8, 10, 11, 12, 14, 16, 18, 20, 22, 23, 24, 26, 28, 30, 32, 34, 36 and 38 mm.

In one embodiment, the size of the filter can be adjusted depending on the size and form of the cathode. In fact, the cathode itself can have different shapes including rectangular, quadratic, circular elliptical to name a few. The depth of the filter plates can be 10 to 50 mm. The depth of the filter plates includes all values and subvalues therebetween, especially including 15, 20, 25, 30, 35, 40, 45 mm.

The distance between the filter and the arc cathode is preferably between 40 to 100 mm. The distance between the filter and the arc cathode includes all values and subvalues therebetween, especially including 45, 50, 55, 60, 65, 70, 75, 80, 85, 90 and 95 mm. A particularly preferred distance between the filter and the arc cathode is 80 mm or about 80 mm.

Figure 2:
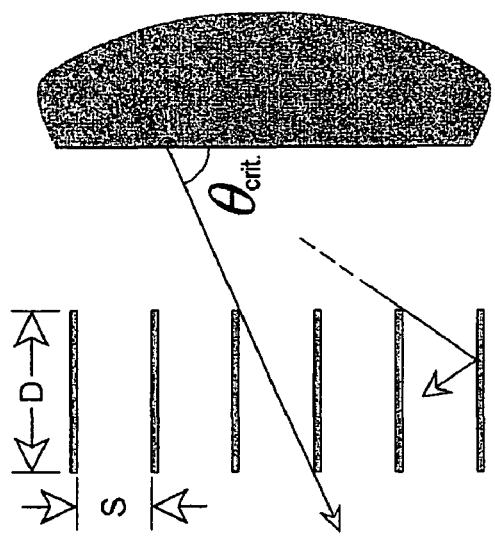
FIG. 2 illustrates how the distance of the filter influences the focusing behavior of an uncontrolled cathodic vacuum arc.

FIGS. 2 (a) and b)) illustrates how the distance of the filter influences the focusing behavior of the random vacuum arc. An preferred distance of 80 mm or about 80 mm was found. At this distance stable focusing behavior can be observed, since the "visible" anode area is sufficiently large. Theta (not shown in FIG. 2) must be below theta critical. "BN" in FIG. 2 b) refers to boron nitride electrical insulators. In FIG. 2b) the adjusted position marked by dotted line and arrows shows the increase in the anode surface area in line-of-sight of the cathode.

In the context of the present invention, a random arc means a random movement of the arc over the cathode material. In contrast, a controlled arc movement can be achieved in the present invention due to a magnetic field which controls the arc movement on a certain track over the cathode material. Both, a random and a controlled arc can be used for the present invention. In addition, the filter system of the present invention can be used for rectangular and circular geometries of arc-cathodes. Also special geometrical arrangements of arc-cathodes can be used for the present invention as discussed above.

An investigation of the filtering effect by means of scanning electron microscopy (SEM) shows (FIG. 3) that the filtering action increased as the element spacing became smaller. Compare the SEM micrographs for unfiltered deposition and deposition using the filter of the present invention with a filter plate spacing of 23 mm and 11 mm. The magnification of the SEM images is about 3100 and e-beam voltage for the SEM is about 25 kV.

A quantitative evaluation of the figures (FIG. 4 and FIG. 5) with sufficient statistics revealed a distinct change of the size distribution of the droplets. This is explained by the interaction of the partly molten particles with the filter elements. For larger droplets (in the order of 1.0 to 1.6 µm), a reduction of >80% in density was observed. For the results in FIGS. 4 and 5 the amount of droplets in SEM images was counted and are shown as droplets per unit area. The droplet size was determined by the magnification of the SEM image (about 3100).

The influence of the filter on the coating rate is an important aspect, since the economics of the method are directly influenced thereby. Adjustment of nitrogen partial pressure and filter geometry permit coating with a rate of up to 0.83 µm/h for the first filter system. Compared with the coating rate using unfiltered plasma (3.4 µm/h, FIG. 6), this corresponds to a reduction of approximately 75% in coating rate. A nitrogen partial pressure of 2-7 Pa, preferably 3-5 Pa, most preferably about 3 Pa can be used. The nitrogen partial pressure includes all values and subvalues therebetween, especially including 2.5, 3, 3.5, 4, 4.5, 5, 5.5, 6, 6.5 Pa. In one embodiment, the nitrogen partial pressure is identical to the deposition pressure.

Preferred embodiments of filter structures are filters I, II or III. Filters II and III are particularly preferred. A summary of the properties of filters I, II and III is shown in FIG. 10.

Filter I

The present chapter discusses the first tests of a Venetian blind droplet filter. The simplicity of this first design was such that it was not capable of operating in the through-current mode. The principal objective was to determine the droplet reduction efficiency of the filter rather than maximizing plasma throughput. The filter could be mounted at floating, negative or positive potential. Results are given for two filter geometries, namely, filter spacings of 11 and 23 mm. In each case the filter depth was 25 mm.

The main geometrical variables of a Venetian blind filter are the depth, the spacing and the angle of the filter elements. The depth of the filter is characterized as the distance from the front to the back of the filter in the direction perpendicular to the cathode surface. This dimension is limited by the available space within the coating chamber, in particular, the position of the cathode on one side and basket holding the substrates on the other. A filter depth of 25 mm was chosen for the first filter and initial testing was conducted with a distance of 43 mm between the filter and the cathode surface.

Selecting the size of the filter spacing was made by considering the likely angular distribution of the droplet emission from the arc spot.

Filter II

The objective was to redesign the droplet filter I so that it could generate a magnetic field with field lines running parallel to the direction of plasma flow, because it was shown at filter I, that magnetic fields can be an effective method for manipulating the plasma flow in reactive deposition of wear resistant nitride coatings. This was done by passing an electric current through the filter elements in such a way that the current flow was reversed in neighbouring elements. To simplify the concept, the filter can be considered as a stack of wires through which electric current is passed.

The droplet filter II was designed compared to the previous filter, consisting of a stack of stainless steel elements. However, the elements of the new 'magnetic' filter were mounted to an isolated frame in such a way that an electric current could be passed in series between the respective elements. It should also be noted that the frame was designed in such a way that it could expand and contract as the length of the elements changed due to thermal expansion. Filter II was designed with a curvature of the filter elements in alignment with the inside of the chamber wall.

Filter III

The Venetian blind filter III was based on the above design characteristics. The filter III has a significantly greater depth so that the cathode to filter distance is reduced. In doing so, the distance, and therefore time, for droplet solidification will be reduced so that the droplets will be more likely to impact the filter in the molten state. By increasing the filter depth, the spacing can be also increased while maintaining the same critical angle for at least one impact with the filter. This is illustrated in FIG. 11.

In order to position the filter closer to the cathode it must be at positive potential to minimize the impedance between the cathode and anodes. The new filter is mounted to anode potential and constructed from copper plates. To maintain structural integrity at the expected operating temperatures, the thickness of the copper is of about a factor of three times greater than the stainless steel used in the previous filter designs. The subsequent reduction in area by the thicker plates will be offset by the reduction in the overall number of plates as a result of the increase in spacing.

Figure 11:
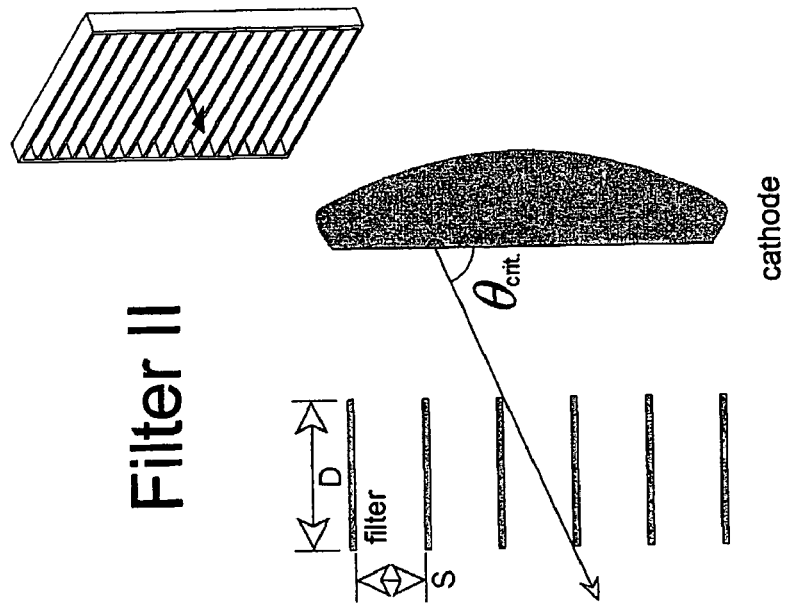
FIG. 11 is a schematic comparing the filter geometry of filters II and III.
Figure 11:
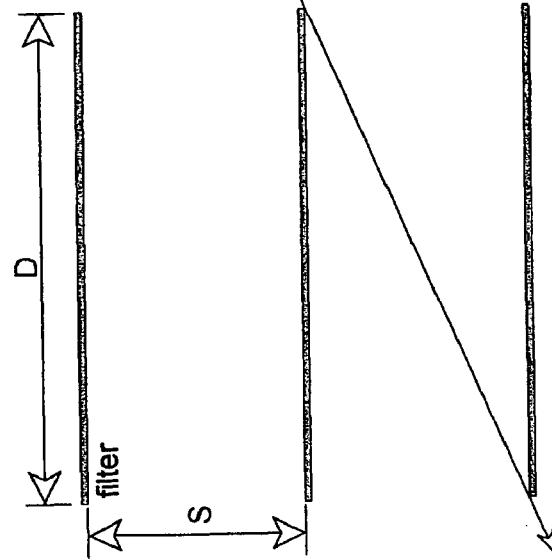

FIG. 11 is a schematic of the filter geometry of filter III showing the same θcrit and an increase in filter spacing (S) and filter depth (D), compared to the filter geometry of filters I and II.

In the present invention, the focusing behavior and the thermal loading of the filter are influenced mainly by the electrical potential of the filter. The anode potential may be in the range of 15-20 V or a floating potential may be used.

In one embodiment, the filter has an anode potential of 15-20 V, including all subvalues in particular, 16, 17, 18, and 19 V, or a floating potential. Floating potential means that the potential of the filter is not defined (floated) and depends mostly on the plasma potential.

For implementation of the filter technique in production plants, an increase of the deposition rate will be necessary in order to guarantee stable continuous operation and efficient utilization of the vaporized material. Experiments with different potentials at the filter, by analogy with the preliminary experiments on filter I, were performed for this purpose. A distinct increase of the deposition rate was achieved. The small spacing of 11 mm leads to preferred reduction of the droplets in the hard-material coats. Preferably, varying the filter plate spacing and/or the filter distance are meaningful to obtain an increase in deposition rate. A further increase in deposition rate can be achieved by the increase of arc current, for example, from 300 A to a maximum value of 450 A. This current value is specific for the large area rectangular cathodes with random arc distribution. Other arc techniques do have lower current ranges.

The influence of an external magnetic field on the filter efficiency was also investigated. In this way the plasma is "magnetized", so that the free electrons are forced onto circulating paths around the magnetic lines of force. The quasi-neutrality of the plasma results in ambipolar diffusion of the ions. This effect guides the plasma through the Venetian blind filter, while the electrically neutral droplets remain unaffected. Coating experiments showed that it was possible to increase the coating rate up to 1.5 μm/h in this way. The solenoid current per loop can be between 30-60 A (6 loops).

It was discernible, however, that the rate could be increased very substantially by optimizing the solid angle Θ.

Second Embodiment

In developing a second filter system (filter II), special attention was paid to the stability of the system relative to thermal expansion during operation. In a stable system, stainless steel elements of the filter can be mounted in such a way, that they could expand and contract as the length of the elements changes due to thermal expansion.

Figure 7:
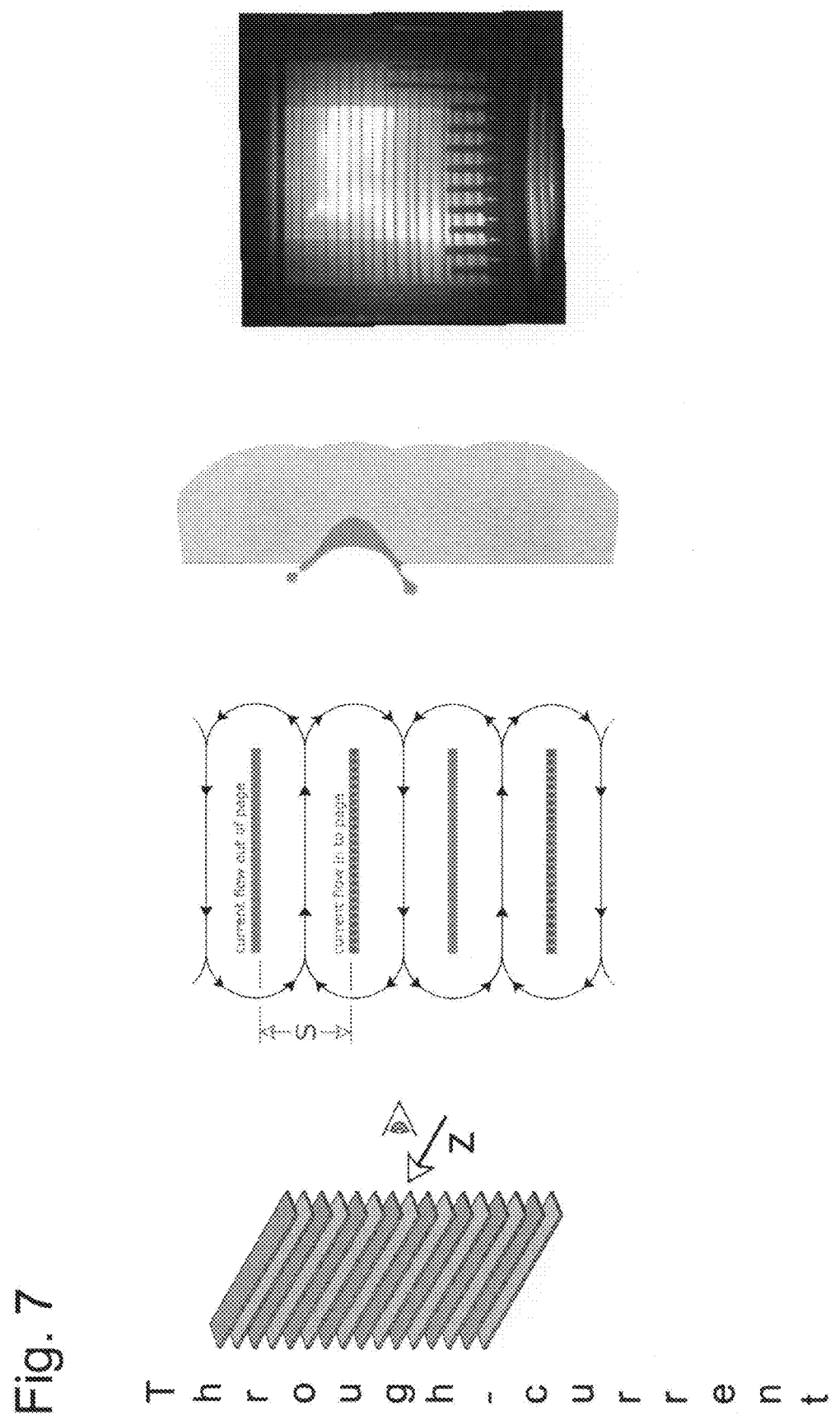
FIG. 7 shows a filter system according to an embodiment of the present invention.

This second filter system (filter II) is illustrated in FIG. 7. By virtue of the design, it is possible to pass a current for inducing a magnetic field directly through the filter by means of insulated suspension of the filter elements. "S" in FIG. 7 refers to the spacing of the filter plates. A schematic of the side view of the magnetic filter is given in FIG. 7 which shows four stacked filter elements and the subsequent magnetic field lines for current flowing in opposite directions in neighbouring elements. It can be seen that by alternating the direction of current flow, the magnetic field between the elements is accumulative since the field lines have the same direction. It can also be seen that the direction of the field lines is parallel to the filter elements and perpendicular to the cathode surface.

Figure 8:
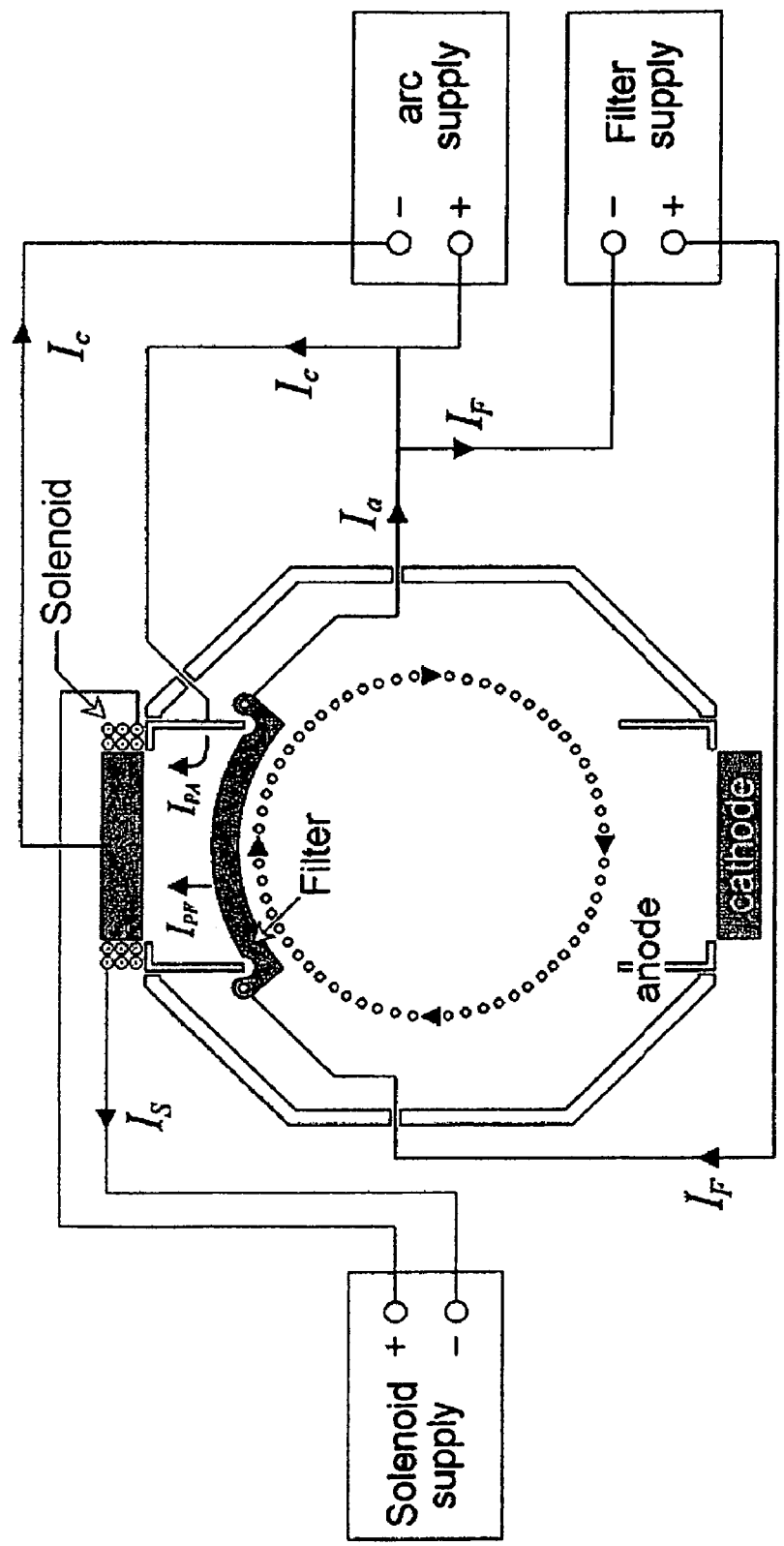
FIG. 8 shows the corresponding wiring of power supplies and the definition of the currents for the filter system shown in FIG. 7.

The corresponding wiring of power supplies and the definition of the currents is illustrated in FIG. 8. The symbols in the FIG. 8 are defined as follows: $I_S$=solenoid current, $I_C$=cathode current, $I_a$=anode current, $I_F$=filter current, $I_{PF}$=current plasma-filter, $I_{PA}$=current anode-filter. The wiring diagram for the through-current magnetic filter and the external solenoid showing the negative terminal of the filter power supply connected to the positive terminal of the arc power supply to produce a positive potential on the filter. One method to overcome the uneven distribution is to increase the potential of the filter so that it is positive with respect to the plasma. This can be done by connecting the negative terminal of the filter power supply to the positive terminal of the arc power supply so that the filter is always at a positive potential relative to the cathode, and hence plasma. In doing so, the filter draws electrons from the plasma and the impedance of the system is reduced and the arc distribution is homogeneous.

Figure 9:
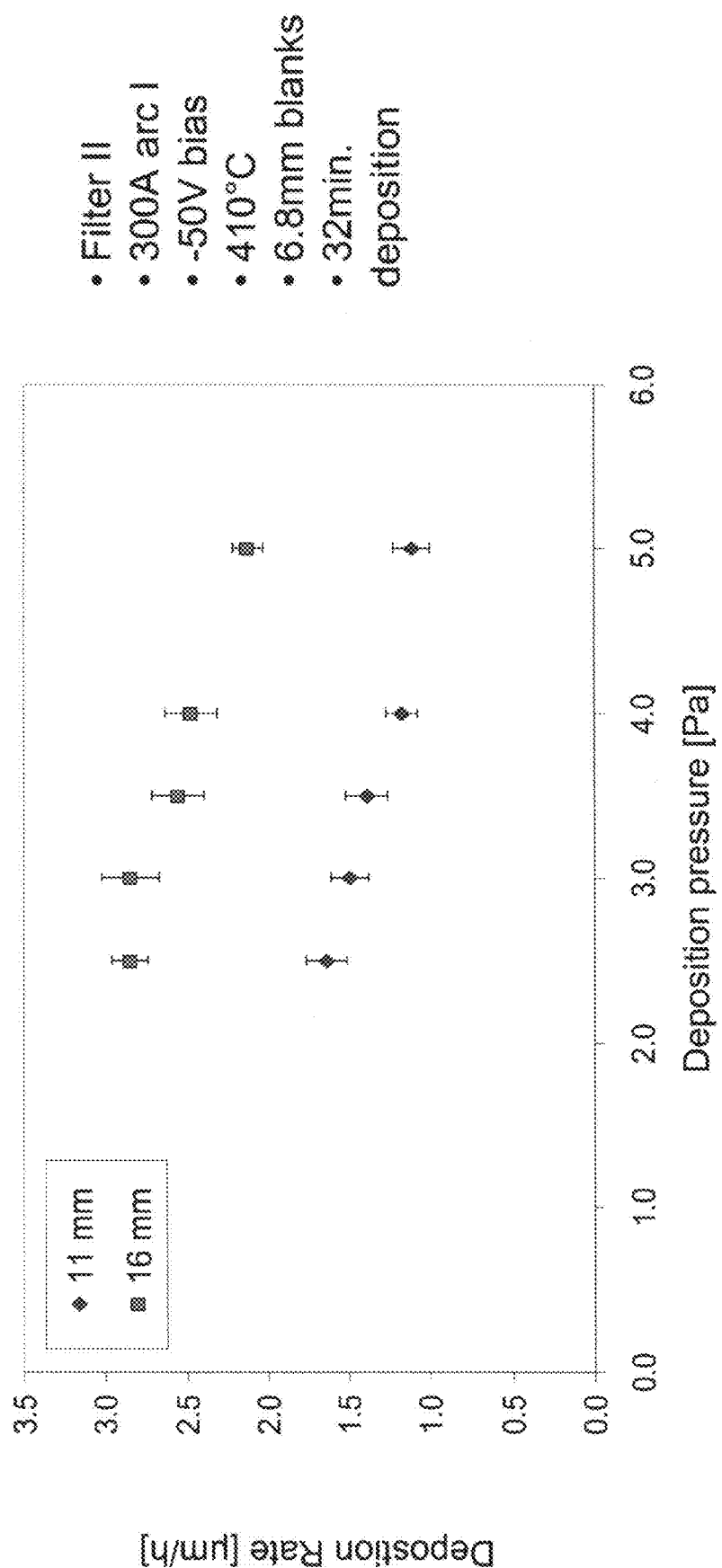
FIG. 9 shows results of coating experiments with the filter system shown in FIG. 7.

The overall view of the results led to a preferred configuration of the filter systems: filter at anode potential (15-20 V), external magnetic field (40 A per cable, coil with 6 turns). FIG. 9 shows results for a broad range of coating experiments with this arrangement. The coating rate increases with decreasing chamber pressure. The resulting coating roughness is no longer acceptable below 3.0 Pa. From this series of measurements, a preferred parameter set was defined for a preferred filter system: process pressure 3.0 Pa, 11 to 16 mm Venetian blind filter spacing, filter at anode potential, external magnetic field of 40 A per cable, with 6-turn coil.

Filters I and II can both be used in open and closed mode. However, the open configuration is preferred, because of the much higher deposition rate. The present invention provides a method for producing droplet-free wear resistant coatings for cutting tools so as to satisfy the increased surface quality requirements for high-tech applications, such as chip-removing machining of superalloys, carbon steels, Al—Si alloys and applications with high-level cutting parameters (high-speed cutting HSC and high-performance cutting HPC).

Heretofore no filter systems have been used in industrial arc-coating plants for reduction of droplets in wear resistant coatings. The economic implementation of the invention will mean a major advance for the arc-coating method on the industrial scale. On the basis of the process technique, the structural and mechanical properties are superior to those of other coating methods, such as magnetron sputtering method. With the deposition of droplet-free wear resistant coatings on HSS and hard-metal chip-removing cutting tools and also wear parts, the innovative arc-coating technology has achieved a further technological advance.

Having generally described this invention, a further understanding can be obtained by reference to certain specific examples which are provided herein for purposes of illustration only, and are not intended to be limiting unless otherwise specified.

EXAMPLES

Example 1

Figure 3:
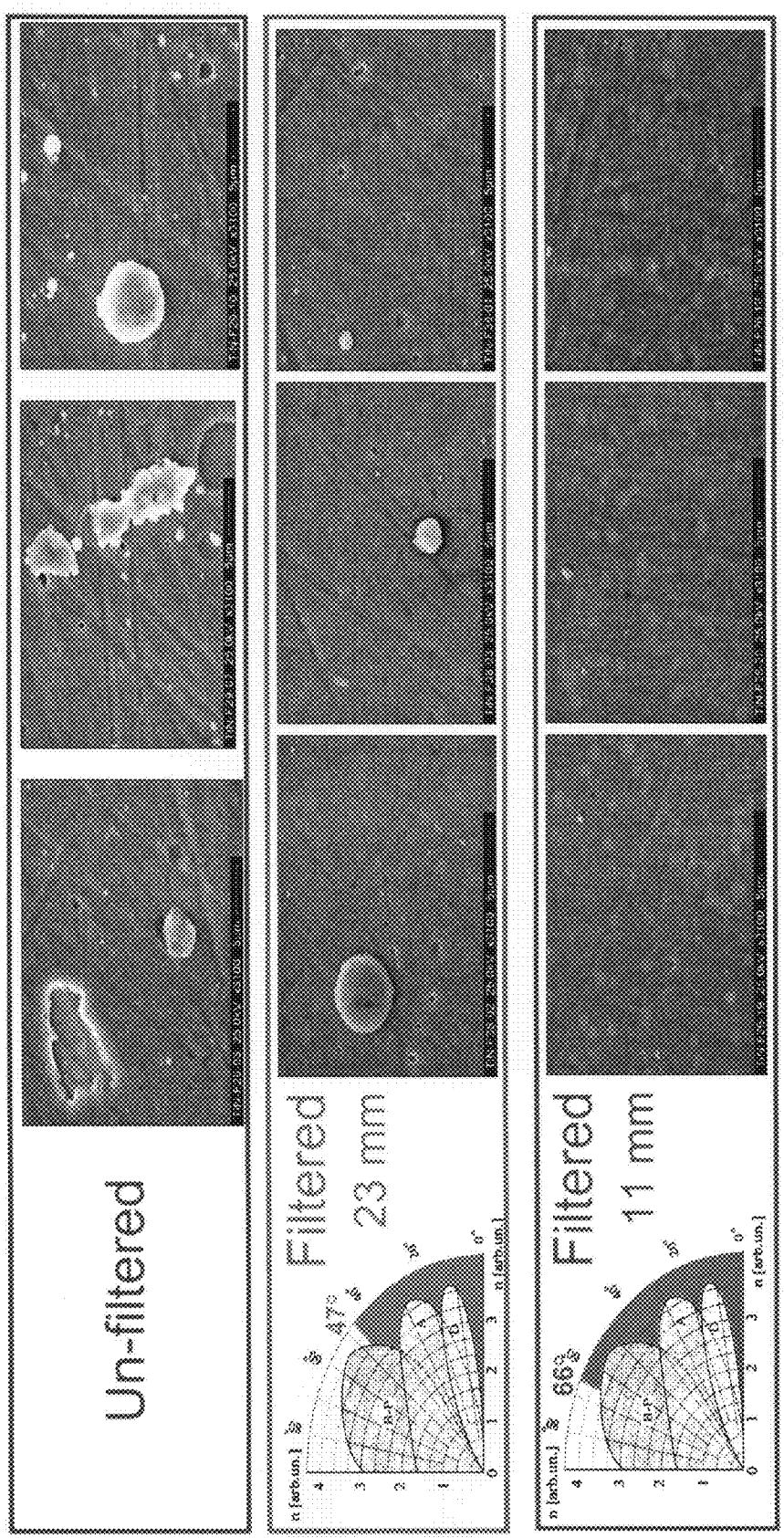
FIG. 3 shows the filtering effect by scanning electron microscopy images of TiN coatings, which were deposited by cathodic arc evaporation using a Venetian blind filter system.
Figure 4:
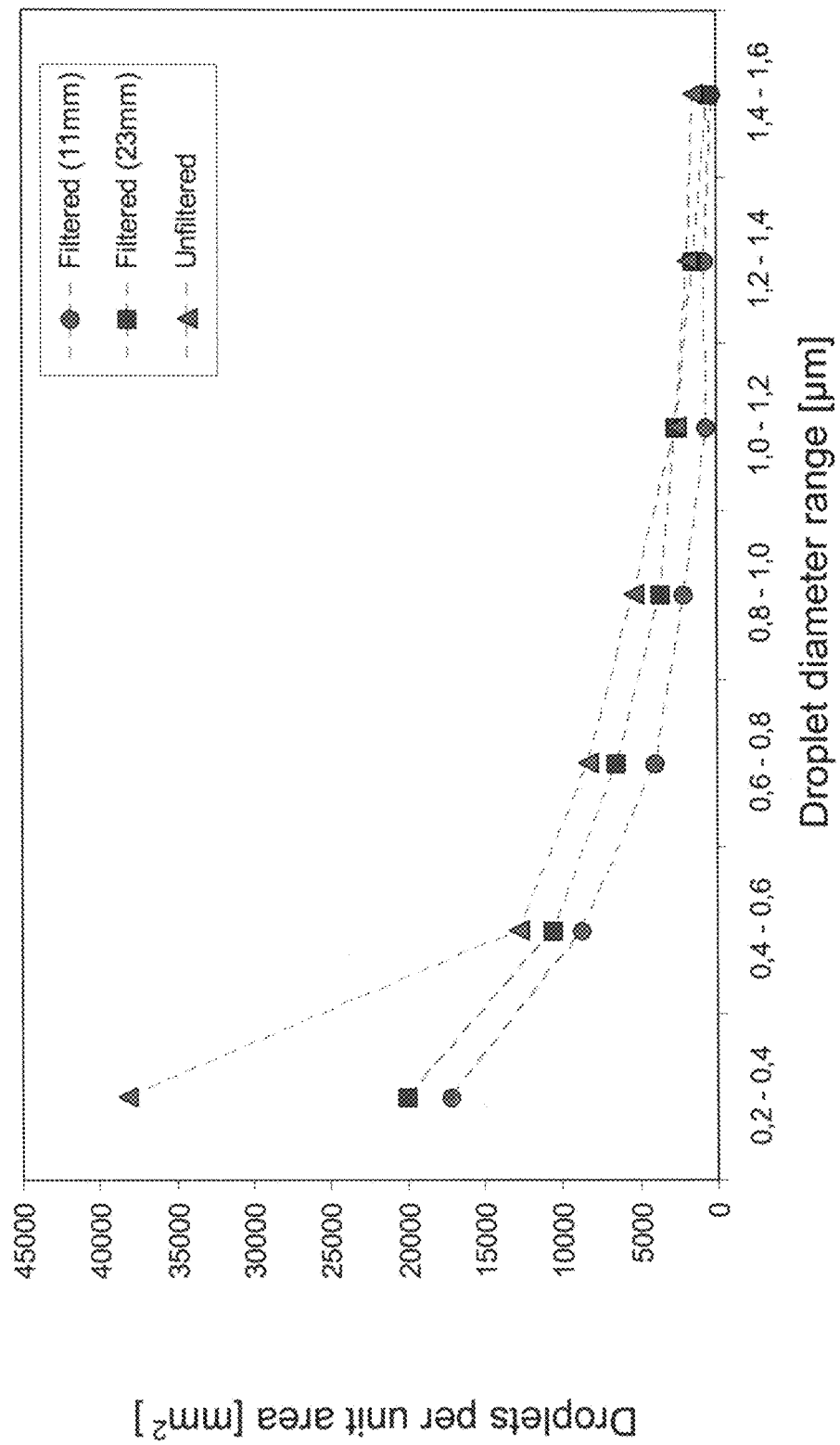
FIG. 4 shows the dependence of droplets per unit area from the droplet diameter.
Figure 5:
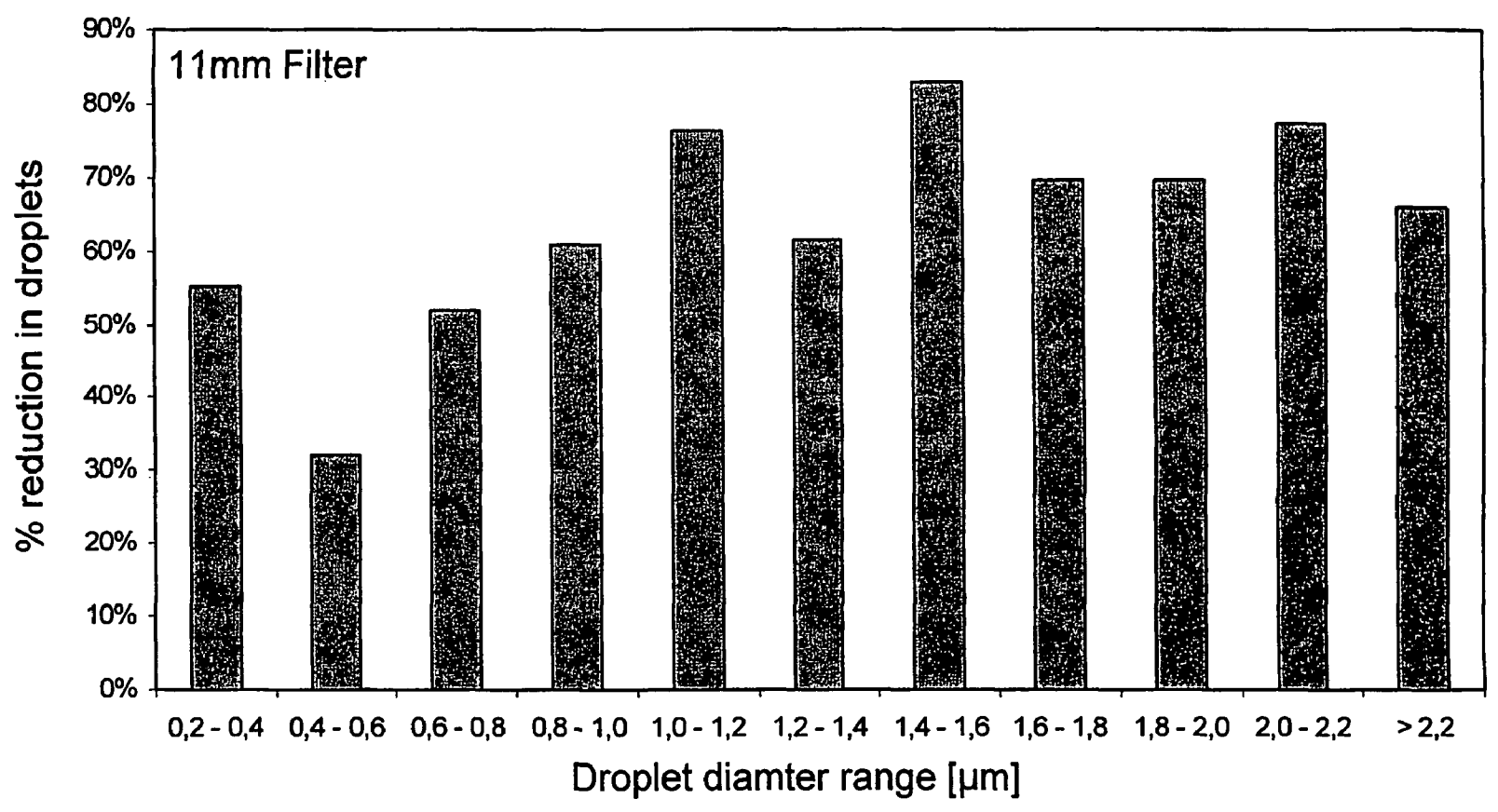

Investigation of the Filtering Effect by Scanning Electron Microscopy (SEM) (FIGS. 3-5)

The coatings were deposited using an arc current of 300 A, a temperature of 410° C., a deposition time of 32 minutes and nitrogen partial pressures between 2.0 and 7.0 Pa. See the configuration of filter I above. The coatings were investigated using scanning electron microscopy and the micrographs are shown in FIG. 3 for the respective coatings. It can be seen in these images that the unfiltered TiN coatings featured numerous large droplets and associated pitting defects. The latter were a result of the droplets breaking away from the surface after deposition. In contrast, the coatings deposited using the 23 mm filter showed a significant reduction in the number and size of droplets. In the case of the 11 mm filter, these coatings showed a further significant reduction in the size and number of droplets with evidence that only small droplets with a maximum diameter of 1 to 2 μm were deposited.

The results in FIG. 4 show the number of droplets deposited and pitting defects per unit area. Of particular interest is an understanding of which droplets were most effectively filtered from the plasma. This can be seen in FIG. 5 which shows the percentage reduction in droplets for various diameters. It is evident that the larger droplets above 1 μm diameter were filtered from the plasma with an efficiency as high as 83%. In contrast, the smaller droplets in the diameter range 0 to 0.8 μm were filtered with efficiency between 30 and 55%. Without intending to be bound to theory, it is proposed that this result is due to the fact that the large droplets were broken up into clusters of smaller droplets when impacting with the filter elements rather than completely adhering to the filter.

Schematic diagram of the plan view of the original filter position (FIG. 2). The adjusted position showing the increase in the anode surface area in line-of-sight of the cathode.

SEM measurements are shown in (FIG. 3).

Measurement of Droplet Diameter

A quantitative evaluation of the figures (FIG. 4 and FIG. 5) with sufficient statistics revealed a distinct change of the size distribution of the droplets. This is explained by the interaction of the partly molten particles with the filter elements. For larger droplets (in the order of 1.0 to 1.6 μm), a reduction of >80% in density was observed. For the results in FIGS. 4 and 5 the amount of droplets in SEM images was counted and are shown as droplets per unit area. The droplet size was determined by the magnification of the SEM image (magnification about 3100).

Example 2

Figure 6:
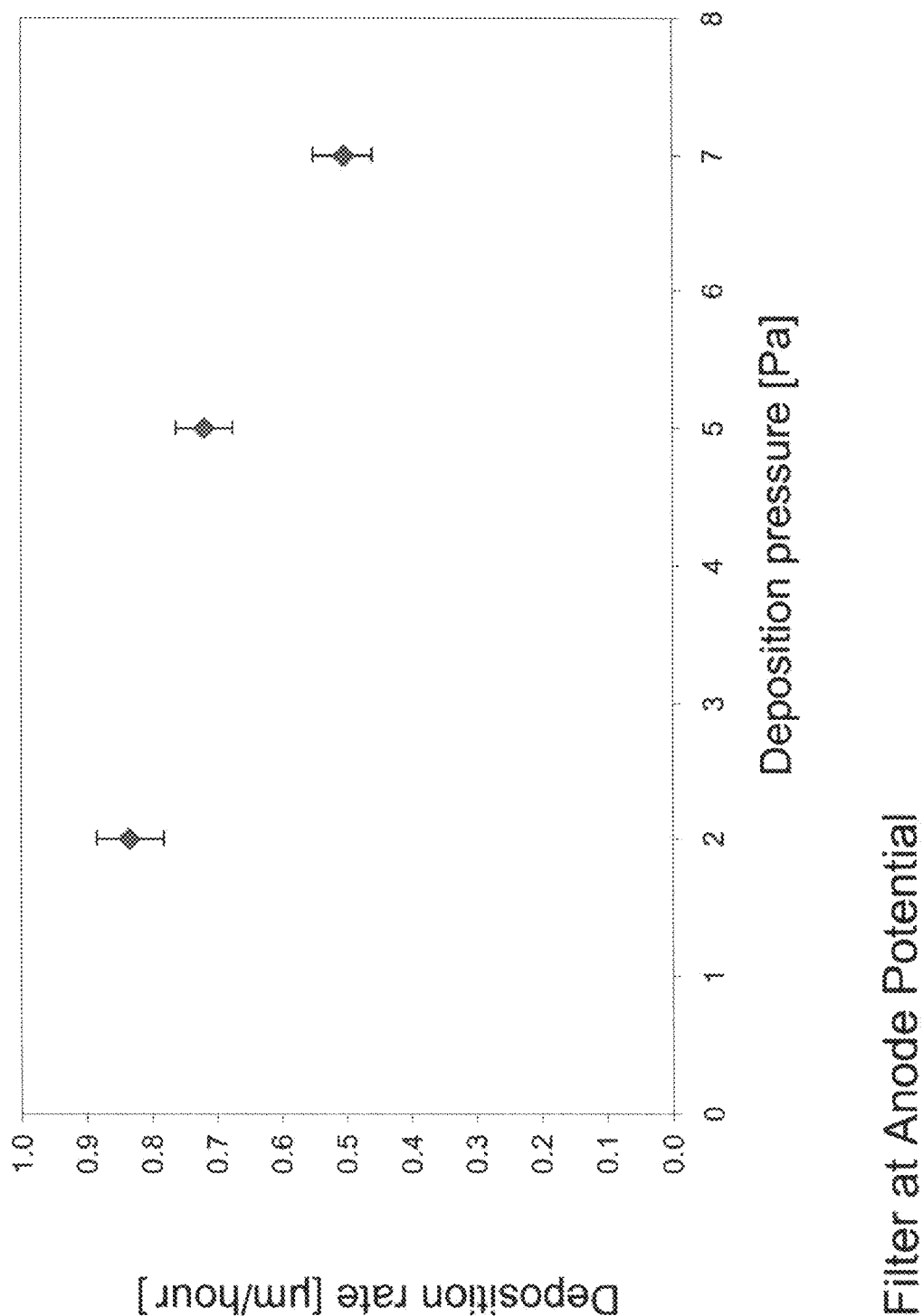
FIG. 6 shows the dependence of deposition rate from the deposition pressure.

Investigation of the Influence of the Filter Configuration on the Coating Rate (FIG. 6)

The results of the first filtered coatings deposited using the 11 mm filter. It can be seen that the deposition rate increased by 40% from 0.5 to 0.83 μm/hour with a reduction in chamber pressure from 7.0 to 2.0 Pa. Notwithstanding this increase, the deposition rate of all filtered coatings was significantly reduced when compared with the deposition rate for an unfiltered coating. The comparable deposition rate for the unfiltered condition was approximately four microns per hour.

Filter configuration: distance to arc 80 mm, arc current 300 A, bias voltage of the tools −50V, deposition temperature 410° C. See the filter configuration of filter I above.

Measurement of the nitrogen partial pressure was performed using a conventional vacuum pressure gauge.

Determination of the Deposition Rate

The deposition rate was determined by a so-called calotest, where a rotating steel ball forms an elliptic crater into the coating surface. With the elliptic formed coating image one can determine the coating thickness.

Adjustment of nitrogen partial pressure and filter geometry permit coating with a rate of up to 0.83 μm/h (FIG. 6) for the first filter system, compared with the coating rate using unfiltered plasma (3.4 μm/h).

Example 3

Investigation of the Influence of the Filter Configuration on the Coating Rate (FIG. 9)

Filter configuration: distance to arc cathode 80 mm.
Deposition conditions: see text in FIG. 9.
TiN coatings were deposited using the filter with spacings of 11 mm (θcrit.=66°) and 16 mm (θcrit.=47°). Reference samples were also prepared using the standard unfiltered TiN deposition process. The coatings were deposited using an arc current of 300 A, a temperature of 410° C., a deposition time of 32 minutes and nitrogen pressures between 2.5 and 5.0 Pa.

The nitrogen partial pressure was measured as in Example 2.

The deposition rate was determined as in Example 2.

The results are shown in FIG. 9.

German patent application 10 2007 015 587.7 filed Mar. 29, 2007, is incorporated herein by reference.

Numerous modifications and variations on the present invention are possible in light of the above teachings. It is therefore to be understood that within the scope of the appended claims, the invention may be practiced otherwise than as specifically described herein.

The invention claimed is:

1. A method for manufacturing a droplet-free wear-resistant coating, comprising:
   depositing a wear resistant nitride coating comprising
      a nitride layer comprising at least one metal or metal compound of a metal selected from the group consisting of Ti, Cr, Al, Si and a combination thereof,
   on a surface of a substrate by cathodic-arc evaporation using a Venetian blind filter system in front of an arc cathode; thereby reducing metal microdroplets and/or metal microparticles in said wear resistant coating compared to an wear resistant coating obtained without a Venetian blind filter system,
   wherein the filter system comprises Venetian blinds having a spacing of from 5 to 40 mm from one another,
   wherein a density of the metal microdroplets and/or metal microparticles with a geometric dimension of >1.5 μm in cross section is reduced by at least 75% in said coating, and
   wherein a deposition rate is 1.5 to 3.0 μm per hour.

2. The method according to claim 1, wherein a pressure of the deposition is from 2 to 7 Pa;
   wherein said filter has an anode potential or a floating potential; and
   wherein an external magnetic field is generated with a magnetic field coil having 6 to 10 turns and 30 to 60 A per cable.

3. The method according to claim 1, wherein said substrate is a rotating chip-removing tool.

4. The method according to claim 1, wherein said substrate is a drill, end-mill, screw tap or reamer.

5. The method according to claim 1, wherein said Venetian blind filter system comprises the filter-plates which are arranged in a linear Venetian blind structure and oriented parallel to one another in a direction of a plasma flow in open configuration of said Venetian blind filter system.

6. The method according to claim 1, wherein an electric current is passed through filter plates of said filter system, thereby generating a magnetic field.

7. The method according to claim 1, wherein an electric current is passed in opposite direction through adjacent filter plates of said filter system, whereby magnetic lines of force are aligned and pass through spaces between said adjacent filter plates in substrate direction.

8. The method according to claim 1, wherein a density of the metal microdroplets and/or metal microparticles with a geometric dimension of >0.8 in cross section is reduced by at least 75% in said coating.

9. The method according to claim 1, wherein said substrate is a cutting tool or a wear part.

* * * * *